(12) United States Patent
Wasson et al.

(10) Patent No.: US 7,026,076 B2
(45) Date of Patent: Apr. 11, 2006

(54) METHOD OF PATTERNING PHOTORESIST ON A WAFER USING A REFLECTIVE MASK WITH A MULTI-LAYER ARC

(75) Inventors: James R. Wasson, Tempe, AZ (US); Pawitter Mangat, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 138 days.

(21) Appl. No.: 10/377,847

(22) Filed: Mar. 3, 2003

(65) Prior Publication Data

US 2004/0175630 A1    Sep. 9, 2004

(51) Int. Cl.
   *G01F 9/00*    (2006.01)
(52) U.S. Cl. ............................................. 430/5
(58) Field of Classification Search .................... 430/5, 430/322; 428/428, 430; 378/35
   See application file for complete search history.

(56) References Cited

U.S. PATENT DOCUMENTS

| | | | |
|---|---|---|---|
| 5,052,033 A | 9/1991 | Ikeda | |
| 5,286,581 A | 2/1994 | Lee | |
| 6,410,193 B1 | 6/2002 | Stivers | |
| 6,503,669 B1 | 1/2003 | Kaneko et al. | |
| 6,511,778 B1 | 1/2003 | Okazaki et al. | |
| 6,720,118 B1 * | 4/2004 | Yan et al. ...................... | 430/5 |

FOREIGN PATENT DOCUMENTS

WO    WO 00/42473    7/2000

OTHER PUBLICATIONS

Yokoyama et al., "The Development of Bilayered TaSiOx-HTPSM (1)," Proceedings of SPIE vol. 4409 (2001), pp. 164-171.
Yokoyama et al., "The Development of Bilayered TaSiOx-HTPSM (2)," Proceedings of SPIE vol. 4409 (2001), pp. 164-171.

* cited by examiner

*Primary Examiner*—S. Rosasco
(74) *Attorney, Agent, or Firm*—James L. Clingan, Jr.; Robert L. King

(57) ABSTRACT

A patterned reflective semiconductor mask (10) uses a multiple layer ARC (24, 26, 28) overlying an absorber stack (22) that overlies a reflective substrate (12, 14). The absorber stack has more than one layer and an upper layer of the absorber stack has a predetermined metal. The multiple layer ARC overlying the upper layer of the absorber stack has layers of nitrogen, oxygen and nitrogen combined with the predetermined metal of the upper layer of the absorber stack. The oxygen layer in the ARC has less metallic properties than the nitrogen layers therein. In one form, an overlying dielectric layer (30) is positioned on the multiple layer ARC to increase light interference. The ARC provides wide bandwidth inspection contrast for extreme ultra-violet (EUV) reticles.

11 Claims, 1 Drawing Sheet

US 7,026,076 B2

METHOD OF PATTERNING PHOTORESIST ON A WAFER USING A REFLECTIVE MASK WITH A MULTI-LAYER ARC

RELATED APPLICATIONS

This application is related to United States patent application serial number SC12351TP, titled "A Method of Patterning Photoresist on a Wafer Using an Attenuated Phase Shift Mask," filed on even date herewith, and assigned to the assignee hereof.

FIELD OF THE INVENTION

This invention relates to making integrated circuits using masks having an anti-reflective coating (ARC), and more particularly, to making integrated circuits using reflective masks with a multi-layer ARC.

RELATED ART

In the manufacture of semiconductors there has always been the continuing trend of smaller and smaller feature sizes. One of the difficulties has become enough resolution available from the light being used. The wavelengths of the light sources continue to be shorter and shorter. As the wavelengths become shorter, other issues arise, such as the changes in optical properties of the commonly used materials. One approach that has been demonstrated is to use reflective masks, which can be effective even down to the extreme ultra-violet (EUV) wavelengths. A number of issues, however, need to be solved before main stream manufacturing can occur at these very low wavelengths. One of the issues is the ability to adequately inspect the masks for defects. A mask, in a manufacturing context, cannot have defects that, when exposed to the exposing light source, are printed on the semiconductor wafer. Thus, a mask should be able to be inspected for any such defects.

A continuing difficulty with inspection is that the inspection tools may be inspecting at a different wavelength than the mask is receiving during its use in transferring its pattern to the photoresist. Because the optical properties change with wavelength, what is absorbing at one wavelength may be reflective at another wavelength. This problem is particularly acute with EUV. The materials that have been found to be effective at EUV, generally considered to be 10–16 nanometers, for masks are generally highly reflective at longer wavelengths used by inspection tools. A single layer of SiON (silicon oxynitride) has been found to be effective for providing a sufficient contrast for inspection. Some problems with this include providing for inspection at only one frequency because the thickness of the layer determined which wavelength was non-reflecting. This is a problem for several reasons. One is that it is desirable to be able to quickly do pre-screening for gross defects, which is desirably performed by older equipment which will have a longer wavelength. Another is that inspection equipment is moving to shorter wavelengths to improve resolution. Also this single layer of SiON is etched by a subsequent etch after any repairs have been performed. Thus, the ultimate thickness was actually determined by a timed etch, which is less controllable than the thickness of a deposition.

Thus, there is a need for a making semiconductors at lower wavelengths using reflective masks that can be effectively inspected, especially at multiple wavelengths.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment a photoresist layer on a semiconductor wafer is patterned using a reflective mask having stacks with an anti-reflective coating (ARC) that is effective over a relatively large range of wavelengths. The ARC resides over an absorbing layer, which has a metal of at least a first type. The ARC has at least three layers all of which include the metal of the first type. The middle layer of the three layers has a lower extinction coefficient than the other two layers. In the case where the metal of the first type is tantalum, the middle layer in this embodiment is tantalum silicon oxide and the other two layers are tantalum silicon nitride. As an option, a dielectric layer may be placed over the three layer metal-containing layers. This is better understood by reference to the drawings and the following description.

Figure 1:
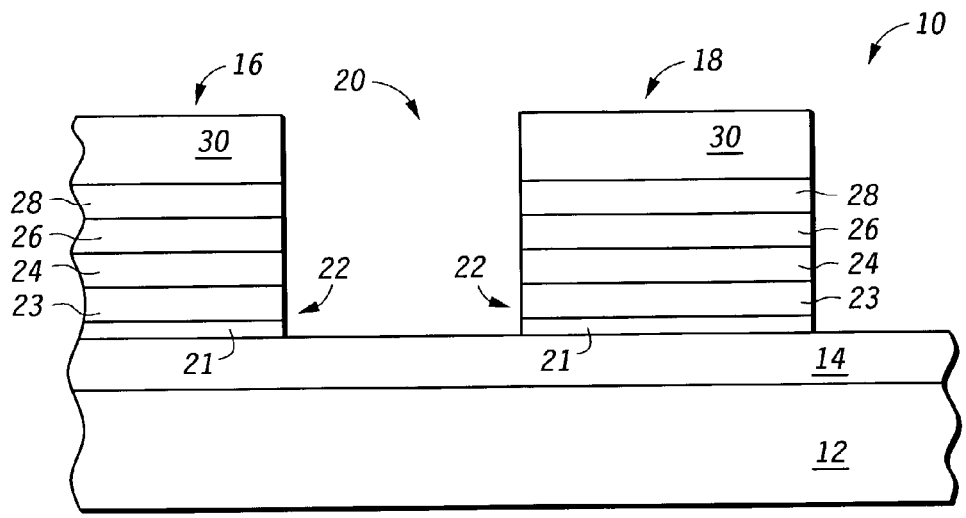
FIG. 1 is a cross section of a mask according to an embodiment of the invention.

Shown in FIG. 1 is a mask 10 having a substrate 12, a reflecting layer 14, a feature stack 16, a feature stack 18, and a reflecting area 20 between stacks 16 and 18. Each stack 16 and 18 has an absorber stack 22 adjacent to reflecting layer 14, a second layer 24 adjacent to absorber stack 22, a layer 26 adjacent to layer 24, a layer 28 adjacent to a layer 26, and a layer 30 adjacent to layer 28. Layer 22. Substrate 12 is preferably silicon oxide but can be a wide variety of other materials. An important consideration for this material is generating little stress and that it provide the needed physical support. Reflecting layer is preferably a series of thin alternating layers of molybdenum and silicon. This is a typical configuration for a reflective mask intended for use with EUV lithography. Absorber stack 22 is preferably a layer 21 of chromium on the bottom with a layer 23 of tantalum silicon nitride over it. The composition of this tantalum silicon nitride layer 23 is only about 2% nitrogen. Layers 24 and 28 are preferably tantalum silicon nitride but with a composition in which there is a significantly higher concentration of nitrogen than that for the tantalum silicon nitride of the absorber layer. Preferably this is about a 5 times higher concentration. Layer 26 is preferably tantalum silicon oxide. The oxygen content is about the same as the nitrogen content for layers 24 and 28. Layer 30 is preferably SiON (silicon oxygen nitride).

The height of stacks 16 and 18 is preferably about 1000 to 1500 Angstroms. With layers 24–30 present over absorbing layer 22, a relatively wide range of wavelengths are not reflected by stacks 16 and 18 in any substantial amount. For inspection purposes these stacks should be less 10% reflective. Stacks 16 and 18 are less than 5% reflective and thus well below the requirement for effective inspection. This was achieved with a thickness of layer 30 of 280 Angstroms and layers 24–28 totaling 200 Angstroms. Each of layers 24–28 was made to be of equal thickness. At the EUV wavelengths these layers 24–30 are nearly as absorbing as the materials present in the absorbing stack 22. Thus, to the extent layers 24–30 add thickness, absorbing stack 22 can be reduced in thickness to achieve a given absorption. Thus, the overall height of stacks 16 and 18 is not adversely affected by the presence of layers 24–30.

The composition of tantalum silicon oxide that was used to exceed the desired goal of less than 10% reflectivity was achieved using a Sputtered Films, Inc., Endeavor AT with a substrate temperature of room temperature, target of $Ta_5Si_3$, sputter gun power at 500 watts of low frequency rf, substrate at rf bias of 20 watts, argon at 18 SCCM, oxygen at 6 SCCM. The composition of tantalum silicon nitride was made the same way except that nitrogen was substituted for oxygen. This rate of nitrogen flow for forming the tantalum silicon nitride in the absorber stack was also the same process except the flow of nitrogen was 1.2 SCCM. SiON was deposited by PECVD.

The thicknesses are chosen based on the particular range of wavelengths that are not to be reflected. In this case, typical inspection equipment will be in the range of 150 to 500 nanometers. Calculations for determining reflections for a wavelength for a stack of layers having given optical properties and thicknesses are known. The optical properties of tantalum silicon nitride and tantalum silicon oxide for this process were measured. These were then used in the calculations to determine the reflectivity. The thickness of layer 30 was first chosen based on a calculation of the thickness that provides minimum reflection of that layer alone at a midpoint of the range of wavelengths desired to be non-reflecting. The next step was to then to calculate the total reflection of layers 24–30 with layers 24–28 at various thickness ratios at particular overall thicknesses of the combined three layers. This gave a range of lower reflectivities based on thickness ratio and overall thickness. Then within that range small iterations were calculated. Also for given thicknesses of layers 24–28 that were found to provide relatively low reflections, calculations of changes in thickness of layer 30 were used to identify further reductions in reflectivity. Because the goal of below 10% reflectivity was easily exceeded by being under 5% over the whole desired range, the need to find the absolute minimum reflectivity was not necessary. The contrast ratio is preferably greater than 70%. The contrast ratio is the ratio of reflection from the background, which is reflection area 20 in this case, minus the reflection from the feature to the total of the reflection of the background and the feature. In this embodiment a contrast ratio of greater than 70% is easily achieved. Typically the contrast ratio is about 90%.

It was found that substantial benefit was achieved using just layers 24–28. The range of reflectivity below 5% is reduced but the midpoint stays the same with the same thicknesses. The range without layer 30 was found to be about 190 nanometers to 270 nanometers. This may be sufficient range to cover relevant inspection tools. If layer 30 is not used, then absorber stack would be increased in thickness to achieve the same absorption at the EUV wavelength being used. Not using layer 30 reduces process complexity. Further this can reduce some processing issues that arise because there may be etching that occurs after stacks 16 and 18 have been formed. If there is such etching, it would also etch layer 30. Thus, layer 30 would be reduced in thickness. Such etch would thus have to be carefully controlled which is more difficult to control than a deposition. Thus, there would be more difficulty in achieving the desired thickness of layer 30 than just layers 24–28. The tantalum silicon nitride layer 28 would not be significantly effected by the late etch because it would be chemistries that are very slow to etch tantalum silicon nitride.

Other metals than tantalum may be used in the absorber stack. In such case there would be benefit in using silicon oxides and silicon nitrides, or even other chemistries, in combination with that same metal type that is used in the absorber stack for the anti-reflective layers 24–28. One example could be tungsten. If tungsten silicon nitride were used over chromium or ruthenium in the absorber stack 22, then layers 24–28 may beneficially be tungsten silicon nitride, tungsten silicon oxide, and tungsten silicon nitride, respectively. Also if just chromium were used as the absorber, then layers may beneficially be chromium nitride, chromium oxide, and chromium nitride, respectively.

Tantalum, however, offers advantages over both chromium and tungsten. Chromium tends to have a relatively large etch bias so that the chromium is etched laterally much more than tantalum. This makes it difficult to maintain feature size. Tungsten creates problems by providing unwanted stress. Much effort has been placed into controlling stress in a tungsten film but with insufficient success for most purposes.

Figure 2:
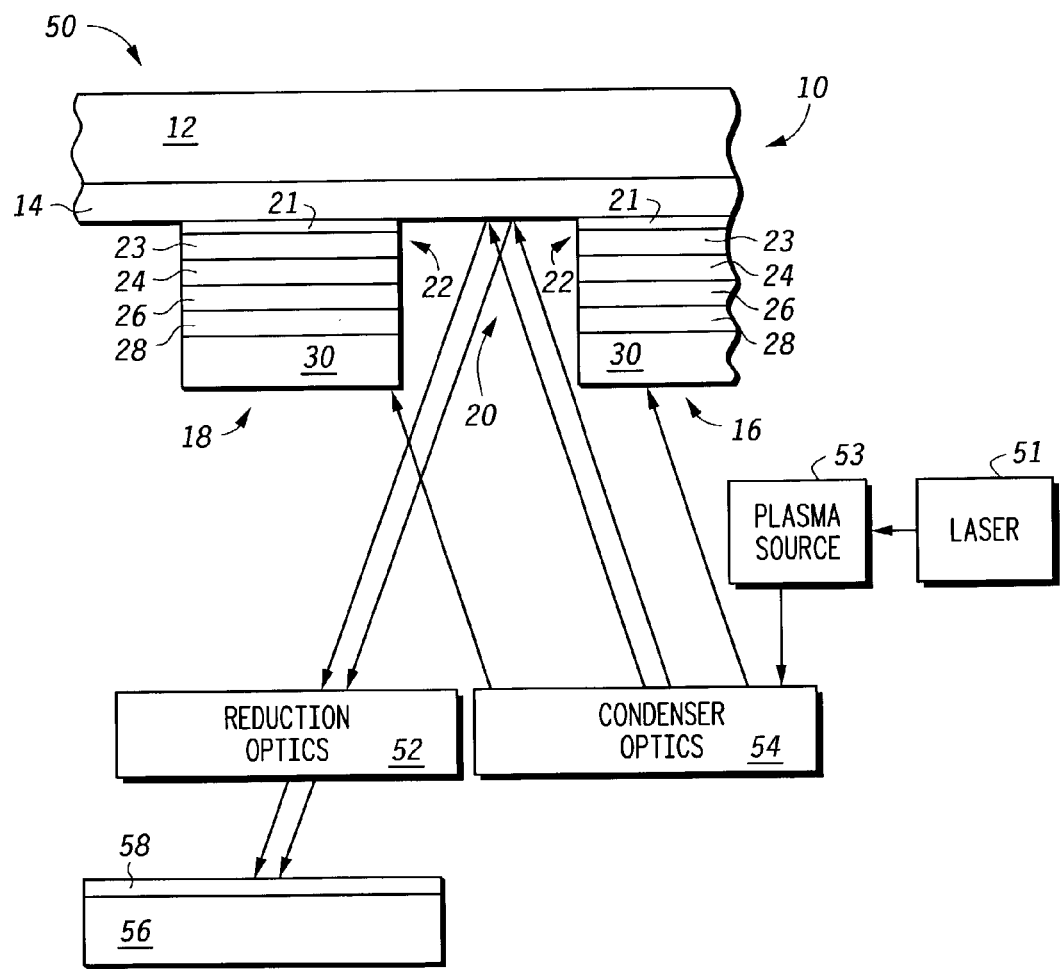
FIG. 2 is an apparatus for using the mask of FIG. 1 to pattern photoresist on a semiconductor wafer.

Shown in FIG. 2 is a lithography system 50 used to pattern a photoresist layer 58 on a semiconductor wafer 56. The lithography system 50 includes a laser 51, a plasma source 53, condenser optics 54, reflective mask 10, reduction optics 52 and the semiconductor wafer 56. Although a variety of sources can provide EUV radiation in lithography system 50, a laser produced plasma source 53 is shown. The source uses a high powered pulsed laser 51, such as Nd:YAG, for activating a supersonic gas jet, such as xenon gas jet. The xenon atomic clusters are heated to high temperatures resulting in the formation of a plasma source 53. From the plasma source 53 collimated light with a wavelength in the EUV regime is emitted and focused by the condenser optics 54 on to mask 10. The collimated light is projected onto mask 10 at an angle, which is typically approximately 5 degrees with respect to the perpendicular axis of mask 10, and reflected. Before impacting the semiconductor wafer 56, the reflected light travels through reduction optics 52, which reflects the light in order to shrink the pattern on mask 10. Typically, reduction optics 52 reduce the pattern off mask 10 by four or five times. From reduction optics 52, the collimated light illuminates photoresist layer 58 formed over semiconductor substrate 56.

In the foregoing specification, the invention has been described with reference to specific embodiments. However, one of ordinary skill in the art appreciates that various modifications and changes can be made without departing from the scope of the present invention as set forth in the claims below. For example, in some cases it may be effective to reverse the tantalum silicon nitride layer with the tantalum silicon oxide layer. It may also be desirable to add an additional layer. For example another layer adjacent to layer 28 or layer 18 may be desirable in some cases. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of patterning photoresist on a semiconductor wafer comprising:
   providing a semiconductor substrate;
   forming a semiconductor mask, the semiconductor mask comprising:
      a mask substrate;
      a reflecting layer overlying the mask substrate for reflecting light from the semiconductor mask;
      an absorber stack selectively formed overlying the reflecting layer, the absorber stack having a plurality of layers, an upper layer of the absorber stack that is opposite the reflecting layer comprises a predetermined metal; and
      a multiple layer anti-reflective coating overlying the upper layer of the absorber stack, the multiple layer anti-reflective coating comprising adjoining layers that respectively have nitrogen, oxygen and nitrogen combined with the predetermined metal of the upper layer of the absorber stack;
   projecting incident radiation on the semiconductor mask;
   reflecting the incident radiation from reflective portions of the reflective mask as reflected radiation; and
   illuminating the photoresist on the semiconductor wafer with the reflected radiation.

2. The method of claim 1 further comprising:
   providing an overlying dielectric layer comprising a predetermined material in the semiconductor mask, the overlying dielectric layer providing additional destructive interference of light for a wider bandwidth of inspection wavelengths.

3. The method of claim 2 further comprising implementing the predetermined material of the overlying dielectric layer as one of silicon oxygen nitride, silicon nitride or silicon oxide.

4. The method of claim 1 further comprising implementing the predetermined metal as one of tantalum, chromium, tungsten, tantalum silicide, tantalum boride and oxides and nitrides thereof.

5. The method of claim 1 further comprising implementing the multiple layer anti-reflective coating comprising adjoining layers with tantalum silicon nitride, tantalum silicon oxide and tantalum silicon nitride, respectively.

6. The method of claim 1 further comprising implementing the multiple layer anti-reflective coating with a concentration of nitrogen and oxygen that is greater than any nitrogen or oxygen in the predetermined metal of the upper layer of the absorber stack.

7. The method of claim 1 further comprising:
   implementing the multiple layer anti-reflective coating with a layer of oxygen within the adjoining layers, the layer of oxygen having less metallic properties than the remaining adjoining layers.

8. The method of claim 1 wherein the semiconductor mask further comprises an inspection contrast of the semiconductor mask is greater than seventy percent (70%) at multiple inspection wavelengths.

9. The method of claim 1 wherein the semiconductor mask further comprises a reflectivity of the multiple layer anti-reflective coating is less than ten percent (10%) at multiple inspection wavelengths.

10. A method of patterning photoresist on a semiconductor wafer comprising:
    providing a semiconductor substrate;
    forming a reflective semiconductor mask, the reflective semiconductor mask comprising:
       a mask substrate;
       a reflecting layer overlying the mask substrate for reflecting light from the semiconductor mask;
       an absorber stack selectively formed overlying the reflecting layer, the absorber stack having a plurality of layers, an upper layer of the absorber stack that is opposite the reflecting layer comprises tantalum silicide; and
       at least three layers of anti-reflective coating overlying the upper layer of the absorber stack, the at least three layers of anti-reflective coating comprising adjoining layers that respectively have nitrogen, oxygen and nitrogen combined with tantalum silicide;
    projecting incident radiation on the reflective semiconductor mask;
    reflecting the incident radiation from a reflective portion of the reflective semiconductor mask as reflected radiation; and
    illuminating the photoresist on the semiconductor wafer with the reflected radiation.

11. The method of claim 10 further comprising:
    forming the reflective semiconductor mask further comprises forming an overlying silicon oxy nitride dielectric layer adjacent the at least three layers of anti-reflective coating, the overlying silicon oxy nitride dielectric layer providing additional destructive interference of light for a wider bandwidth of inspection wavelengths.

* * * * *